(12) United States Patent
Wang et al.

(10) Patent No.: US 9,484,150 B2
(45) Date of Patent: Nov. 1, 2016

(54) MULTI-MODE POWER AMPLIFYING CIRCUIT, AND MULTI-MODE WIRELESS TRANSMISSION MODULE AND METHOD THEREOF

(71) Applicant: REALTEK SEMICONDUCTOR CORP., HsinChu (TW)

(72) Inventors: Po-Chih Wang, HsinChu (TW); Ya-Wen Yang, HsinChu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 449 days.

(21) Appl. No.: 14/045,213

(22) Filed: Oct. 3, 2013

(65) Prior Publication Data
US 2014/0097698 A1  Apr. 10, 2014

(30) Foreign Application Priority Data
Oct. 9, 2012 (TW) .............................. 101137324 A

(51) Int. Cl.
| | |
|---|---|
| H01F 38/14 | (2006.01) |
| H04B 1/04 | (2006.01) |
| H03F 1/02 | (2006.01) |
| H03F 3/34 | (2006.01) |

(52) U.S. Cl.
CPC ............ *H01F 38/14* (2013.01); *H03F 1/0277* (2013.01); *H03F 3/34* (2013.01); *H04B 1/0458* (2013.01)

(58) Field of Classification Search
CPC .................................................. H04B 1/0458
USPC ......................................................... 307/412
See application file for complete search history.

(56) References Cited

U.S. PATENT DOCUMENTS

| | | | |
|---|---|---|---|
| 2007/0096804 A1* | 5/2007 | Bakalski | ................... H03F 1/56 330/51 |
| 2007/0222508 A1 | 9/2007 | Hau | |

FOREIGN PATENT DOCUMENTS

| | | |
|---|---|---|
| CN | 1300132 A | 6/2001 |
| CN | 1742428 A | 3/2006 |
| CN | 101388648 A | 3/2009 |
| CN | 1762097 B | 10/2010 |
| TW | 200943332 A1 | 10/2009 |
| TW | I349449 | 8/2011 |

OTHER PUBLICATIONS

Chinese Office Action in application No. 201210403947.8 dated Mar. 9, 2016. pp. 1-11.

* cited by examiner

*Primary Examiner* — Robert Deberadinis
(74) *Attorney, Agent, or Firm* — Muncy, Geissler, Olds & Lowe PC

(57) ABSTRACT

A multi-mode power amplifying circuit, and a multi-mode wireless transmission module and method thereof are provided. The multi-mode wireless transmission module includes the multi-mode power amplifying circuit and an antenna. In the multi-mode power amplifying circuit and the antenna, a first power amplifier is electrically connected between a signal input end and a first impedance matching circuit, and an output end of the first impedance matching circuit is electrically connected to the antenna. A second power amplifier is electrically connected to the signal input end, and a second impedance matching circuit is electrically connected between the second power amplifier and the first impedance matching circuit. A switching circuit is electrically connected to an input end of the second impedance matching circuit. The switching circuit switches on-off corresponding to an operation of the first power amplifier and an operation of the second power amplifier.

16 Claims, 4 Drawing Sheets

MULTI-MODE POWER AMPLIFYING CIRCUIT, AND MULTI-MODE WIRELESS TRANSMISSION MODULE AND METHOD THEREOF

CROSS-REFERENCES TO RELATED APPLICATIONS

This non-provisional application claims priority under 35 U.S.C. §119(a) on Patent Application No. 101137324 filed in Taiwan, R.O.C. on Oct. 9, 2012, the entire contents of which are hereby incorporated by reference.

BACKGROUND

1. Technical Field

The present invention relates to a power amplifier, and more particularly to a multi-mode power amplifying circuit, and a multi-mode wireless transmission module and method thereof.

2. Related Art

In a wireless communication system, power amplifier is the located at the end of a transmitter. When a small modulated signal is input into power amplifiers, the power of the small modulated signal is amplified by single or multi-stage power amplifiers so as to output a power that complies with required specification.

With the different signal modulations in the wireless communication system, different specifications of transmitters are required and each specification requires different output power. For wireless network standards (for example, 802.11abg standard), the orthogonal frequency-division multiplexing (OFDM) technology is used, which is similar to the amplitude modulation (AM) technology, requiring a high-linearity power amplifier, where the transmission belongs to middle/long distance transmission. Bluetooth technology is mainly applied to short distance transmission, and therefore requires a low-power-consumption power amplifier for low power transmission.

In recent years, communication devices have developed to support multiple wireless transmission technologies; for example, the wireless network standards and Bluetooth technology. To reduce the size of a wireless device, the transmitter is mostly designed to be applicable to high and low power transmission. Consequently, how to maintain an amplifying operation with high power efficiency during transmission at different output powers is one of the issues when designing a power amplifying circuit.

SUMMARY

In view of this, the present invention is directed to a multi-mode power amplifying circuit, and a multi-mode wireless transmission module and method thereof, so as to provide an amplifying operation with high power efficiency, and reduce the electric power consumption or improve the use efficiency of power supply; however, the applications of the present invention are not limited thereto.

According to an embodiment of the present invention, a multi-mode power amplifying circuit includes a signal input end, a first impedance matching circuit, a first power amplifying module, and a second power amplifying module. The first power amplifying module includes a first power amplifier, and the second power amplifying module includes a second power amplifier, a second impedance matching circuit, and a switching circuit.

The first power amplifier is electrically connected between the signal input end and the first impedance matching circuit. The second power amplifier is electrically connected to the signal input end, and the second impedance matching circuit is electrically connected between the second power amplifier and the first impedance matching circuit. The switching circuit is electrically connected to an input end of the second impedance matching circuit. The switching circuit switches on-off corresponding to the operation of the first power amplifier and the operation of the second power amplifier.

According to an embodiment of the present invention, a multi-mode wireless transmission module includes the multi-mode power amplifying circuit described above and an antenna, where the antenna is electrically connected to the first impedance matching circuit.

According to an embodiment of the present invention, a multi-mode wireless transmission method includes: selecting either one of a first output mode and a second output mode according to different modulations, performing corresponding steps according to the selected output mode; and using an antenna to wirelessly output a radio-frequency signal from the first impedance matching circuit.

When the first output mode is selected, the radio-frequency signal is amplified by using a first power amplifier; the radio-frequency signal amplified by the first power amplifier is blocked from flowing into a second power amplifier by adjusting the impedance of a second impedance matching circuit; and the radio-frequency signal amplified by the first power amplifier is transmitted to the antenna through the first impedance matching circuit.

When the second output mode is selected, the radio-frequency signal is amplified by using the second power amplifier; and the radio-frequency signal amplified by the second power amplifier is transmitted to the antenna through the second impedance matching circuit and the first impedance matching circuit.

BRIEF DESCRIPTION OF THE DRAWINGS

The present invention will become more fully understood from the detailed description given herein below for illustration only, and thus not limitative of the present invention, wherein.

DETAILED DESCRIPTION

Power efficiency ($\eta$) of a power amplifier is defined as an output maximum load power ($P_{L(max)}$) divided by an input source power ($P_S$) as shown in the following Formula 1:

$$\eta = \frac{P_{L(max)}}{P_S} = \frac{V_{dd}^2}{2R_L} \qquad \text{Formula 1}$$

where Vdd is an operation voltage and $R_L$ is output impedance.

It can be known from Formula 1 that, under the same operation voltage, if a power amplifier of a high output power and a power amplifier of a low output power both have high power efficiency, the power amplifier of a high output power should have relatively small output impedance; on the contrary, the power amplifier of a low output power should have relatively large output impedance. Therefore, according to the present invention, a multi-mode power amplifying circuit, and a multi-mode wireless transmission module and method thereof are a design of a power amplifying circuit that can convert output impedance, so as to achieve high power efficiency during high and low output power transmission.

Figure 1:
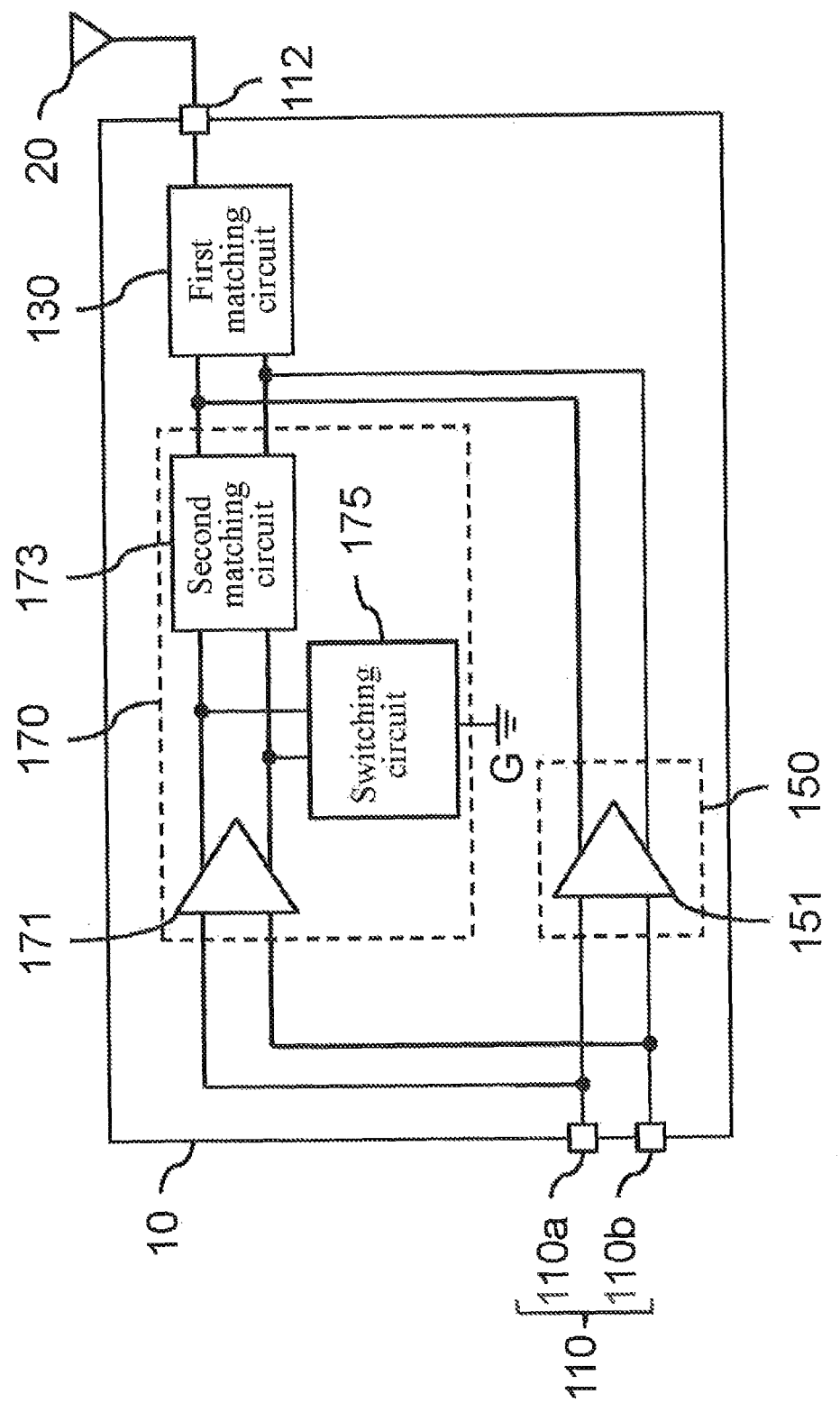
FIG. 1 is a schematic view of a multi-mode wireless transmission module according to an embodiment of the present invention.

Please refer to FIG. 1, in which a multi-mode wireless transmission module includes a multi-mode power amplifying circuit 10 and an antenna 20.

The multi-mode power amplifying circuit 10 includes a signal input end 110, a first impedance matching circuit 130, a first power amplifying module 150, and a second power amplifying module 170.

The first power amplifying module 150 is electrically connected between the signal input end 110 and the first impedance matching circuit 130, and the second power amplifying module 170 is electrically connected between the signal input end 110 and the first impedance matching circuit 130. In some embodiments, the first power amplifying module 150 and the second power amplifying module 170 are electrically connected in parallel between the signal input end 110 and the first impedance matching circuit 130.

The first power amplifying module 150 includes a first power amplifier 151. The first power amplifier 151 is electrically connected between the signal input end 110 and the first impedance matching circuit 130.

The second power amplifying module 170 includes a second power amplifier 171, a second impedance matching circuit 173, and a switching circuit 175. The second power amplifier 171 is electrically connected between the signal input end 110 and the second impedance matching circuit 173. The second impedance matching circuit 173 is electrically connected between the second power amplifier 171 and the first impedance matching circuit 130. The switching circuit 175 is electrically connected between an input end of the second impedance matching circuit 173 and a ground G.

The first impedance matching circuit 130 is electrically connected to the antenna 20 through a signal output end 112. The first impedance matching circuit 130 is electrically connected between the first power amplifier 151 and the antenna 20, and is electrically connected between the second impedance matching circuit 173 and the antenna 20.

The switching circuit 175 performs switch-on and switch-off according to an operation of the first power amplifier 151 and an operation of the second power amplifier 171, respectively.

In some embodiments, the second impedance matching circuit 173 has impedance that is higher than input impedance of the first impedance matching circuit 130. In other words, when the first power amplifier 151 is in operation, the switching circuit 175 switches the electrical connection so as to form an alternating current (AC) ground at an input end of the second impedance matching circuit 173, thereby blocking a radio-frequency signal amplified by the first power amplifier 151 from flowing into the second power amplifier 171 by using the impedance of the second impedance matching circuit 173.

In some embodiments, because an output end of the first power amplifier 151 is physically coupled to an input end of the first impedance matching circuit 130, the input impedance of the first impedance matching circuit 130 is output impedance of the first power amplifier 151.

In some embodiments, because an output end of the second power amplifier 171 is physically coupled to the input end of the second impedance matching circuit 173, input impedance of the second impedance matching circuit 173 is output impedance of the second power amplifier 171. In addition, the output end of the second impedance matching circuit 173 and the output end of the first power amplifier 151 are physically coupled to the input end of the first impedance matching circuit 130; therefore, the output impedance of the second impedance matching circuit 173, the input impedance of the first impedance matching circuit 130, and the output impedance of the first power amplifier 151 are a same impedance.

In some embodiments, the multi-mode wireless transmission module has multiple output modes, and the output modes use wireless transmission specifications of different output powers. The power amplifiers (for example, the first power amplifier 151 and the second power amplifier 171), included in the multi-mode power amplifying circuit 10 each correspond to one output mode. The output mode may be determined by different transmitting technologies, such as Wi-Fi and Bluetooth technologies.

By taking an architecture shown in FIG. 1 as an example, the first power amplifier 151 corresponds to a first output mode and the second power amplifier 171 corresponds to a second output mode. The first power amplifier 151 and the second power amplifier 171 have different powers.

In some embodiments, the first power amplifier 151 has a power higher than that of the second power amplifier 171.

Because the output end of the first impedance matching circuit 130 is coupled to the antenna 20, output impedance of the first impedance matching circuit 130 is generally designed to be 50Ω in coordination with the antenna 20. That is to say, the first impedance matching circuit 130 matches the output impedance of the first power amplifier 151 to 50Ω.

The output impedance of the second power amplifier 171 is larger than the input impedance of the first impedance matching circuit 130. That is to say, the second impedance matching circuit 173 matches the output impedance of the second power amplifier 171 to the input impedance of the first impedance matching circuit 130.

In some embodiments, the output impedance of the second power amplifier 171 is larger than the output impedance of the first impedance matching circuit 130.

The multi-mode power amplifying circuit 10 is an output stage of the multi-mode wireless transmission module. A preprocessing module performs signal processing such as digital-to-analog conversion, filtering and frequency spreading to a signal to be sent, so as to generate a radio-frequency signal. The radio-frequency signal is input into the multi-mode power amplifying circuit 10 through the signal input end 110 for signal amplification.

At this time, the multi-mode power amplifying circuit 10 selects the first output mode or the second output mode according to the radio-frequency signal.

When the radio-frequency signal must be transmitted wirelessly in the first output mode, the radio-frequency signal is input into the first power amplifying module 150 that corresponds to the first output mode, and amplified by the first power amplifier 151. At this time, the switching circuit 175 switches the electrical connection so as to block the radio-frequency signal amplified by the first power amplifier 151 from flowing into the second power amplifier 171 by using the impedance of the second impedance matching circuit 173. The amplified radio-frequency signal is then transmitted to the antenna 20 through the first impedance matching circuit 130 and transmitted wirelessly by the antenna 20.

When the radio-frequency signal must be transmitted wirelessly in the second output mode, the radio-frequency signal is input into the second power amplifying module 170 that corresponds to the second output mode, and amplified by the second power amplifier 171. At this time, the switching circuit 175 switches the electrical connection so as to achieve communication between the output end of the second power amplifier 171 and the input end of the second impedance matching circuit 173. The amplified radio-frequency signal is then transmitted to the antenna 20 through the first impedance matching circuit 130 and transmitted wirelessly by the antenna 20.

Figure 2:
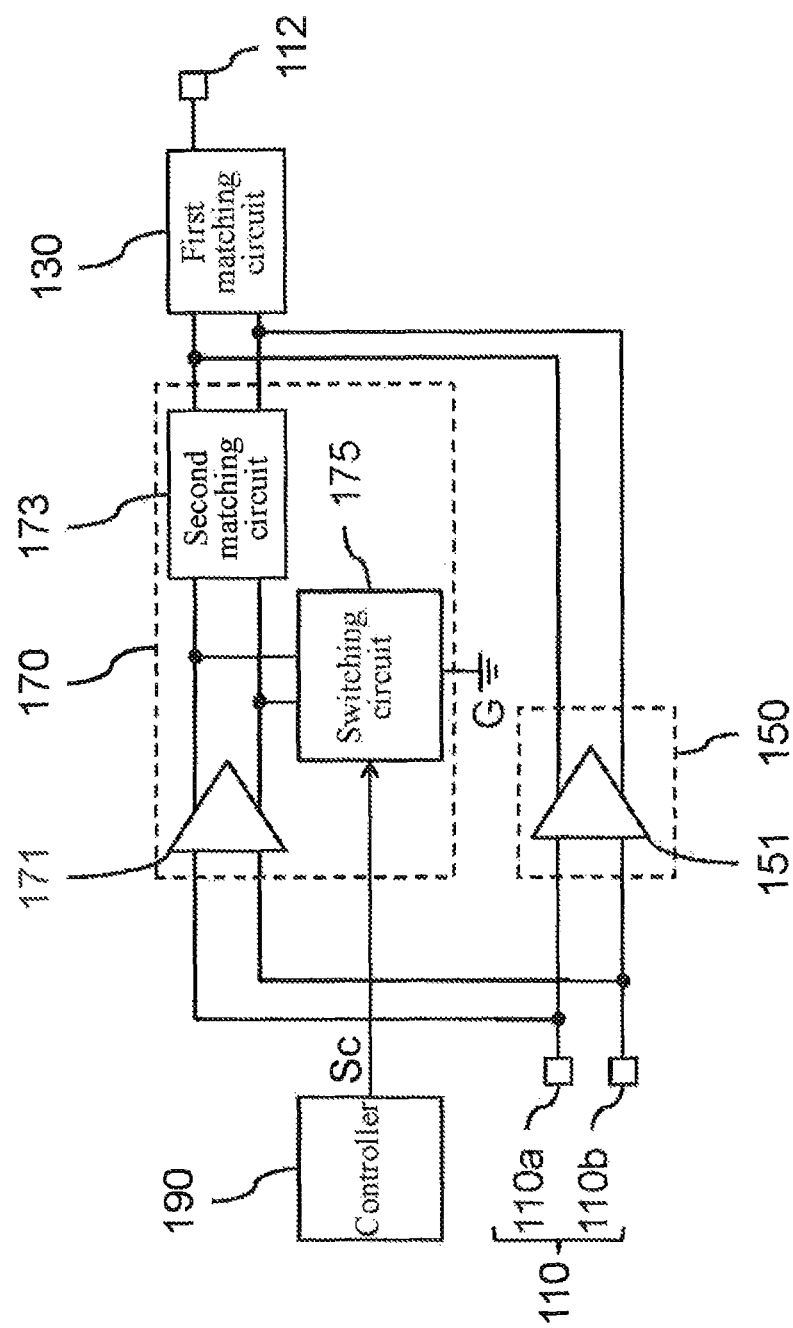
FIG. 2 is a schematic view of a multi-mode wireless transmission module according to another embodiment of the present invention.

In some embodiments, (please refer to FIG. 2), a controller 190 may be set, so as to generate a control signal Sc according to the selected output mode (for example, the first output mode or the second output mode), to control the operation of the switching circuit 175.

Figure 3:
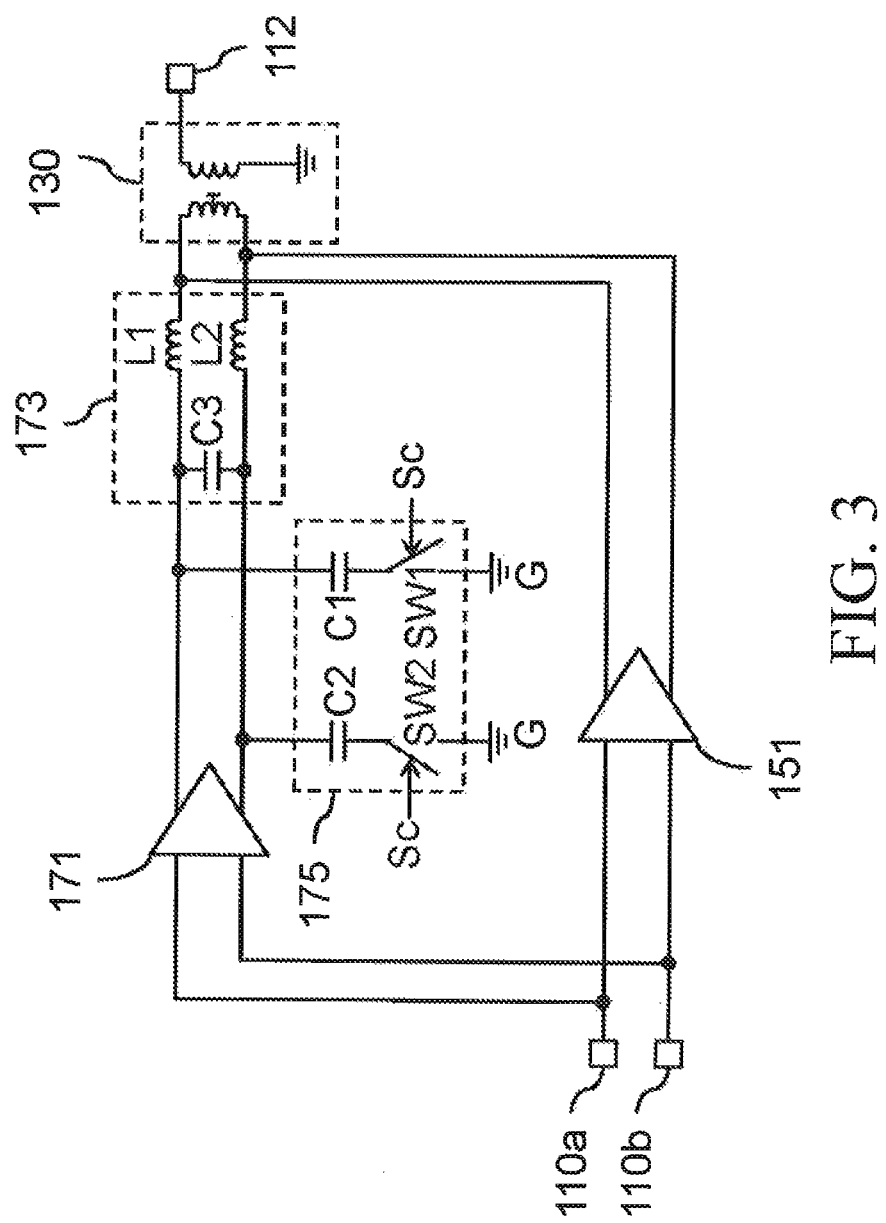
FIG. 3 is a schematic circuit diagram of a multi-mode power amplifying circuit according to an embodiment of the present invention.

In some embodiments, the multi-mode power amplifying circuit 10 may implement a differential operation. Please refer to FIG. 3, in which the signal input end 110 has a first input end 110a and a second input end 11b, where the first input end 110a and the second input end 110b receive a differential radio-frequency signal from the preprocessing module.

Two input ends of the first power amplifier 151 are coupled to the first input end 110a and the second input end 110b, respectively. The output ends of the first power amplifier 151 are coupled to two input ends of the first impedance matching circuit 130, respectively.

Two input ends of the second power amplifier 171 are respectively coupled to the first input end 110a and the second input end 110b, and two output ends of the second power amplifier 171 are respectively coupled to two input ends of the second impedance matching circuit 173. In addition, two output ends of the second impedance matching circuit 173 are respectively coupled to the two input ends of the first impedance matching circuit 130.

A positive output end of the first impedance matching circuit 130 is coupled to the signal output end 112, and a negative output end of the first impedance matching circuit 130 is coupled to the ground G.

In some embodiments, the first impedance matching circuit 130 may be an impedance converter.

The two output ends of the second impedance matching circuit 173 are respectively coupled to two ends of a primary side of the impedance converter. The two output ends of the first power amplifier 151 are also respectively coupled to the two ends of the primary side of the impedance converter.

Two ends of a secondary side of the impedance converter are respectively the positive output end and the negative output end. That is to say, the two ends of the secondary side of the impedance converter are respectively coupled to the signal output end 112 and the ground G.

In some embodiments, (please refer to FIG. 3), the switching circuit 175 may include a capacitor C1, a capacitor C2, a switch SW1, and a switch SW2.

A first end of the capacitor C1 is coupled to an input end of the second power amplifier 171 and an input end of the second impedance matching circuit 173. A first end of the capacitor C2 is coupled to the other input end of the second power amplifier 171 and the other input end of the second impedance matching circuit 173.

The switch SW1 is coupled between a second end of the capacitor C1 and the ground G; and the switch SW2 is coupled between a second end of the capacitor C2 and the ground G. A control end of the switch SW1 and a control end of the switch SW2 are coupled to the controller 190.

The switch SW1 performs switch-on and switch-off according to the control signal Sc generated by the controller 190, so as to determine whether to conduct the capacitor C1 and the ground G. The switch SW2 performs switch-on and switch-off according to the control signal Sc generated by the controller 190, so as to determine whether to conduct the capacitor C2 and the ground G.

The capacitor C1 and the capacitor C2 have larger capacitances, for example, the capacitances are both larger than 4 pF.

When the radio-frequency signal must be transmitted wirelessly in the first output mode, the switch SW1 conducts the capacitor C1 and the ground G according to the control signal Sc, and the switch SW2 conducts the capacitor C2 and the ground G according to the control signal Sc, so as to form an AC ground at the input end of the second impedance matching circuit 173. At this time, because the impedance of the second impedance matching circuit 173 is larger than the input impedance of the first impedance matching circuit 130, the signal output by the first power amplifier 151 flows to the first impedance matching circuit 130 instead of the second power amplifier 171.

In some embodiments (please refer to FIG. 3), the second impedance matching circuit 173 may include a capacitor C3, an inductor L1, and an inductor L2.

The capacitor C3 is coupled to the output ends of the second power amplifier 171. In a differential mode, the capacitor C3 is coupled between the two output ends of the second power amplifier 171.

The inductor L1 is coupled between an output end of the second power amplifier 171 and an input end of the first power amplifier 151 (one end of the primary side of the impedance converter). The inductor L2 is coupled between the other output end of the second power amplifier 171 and the other input end of the first power amplifier 151 (the other end of the primary side of the impedance converter).

Figure 4:
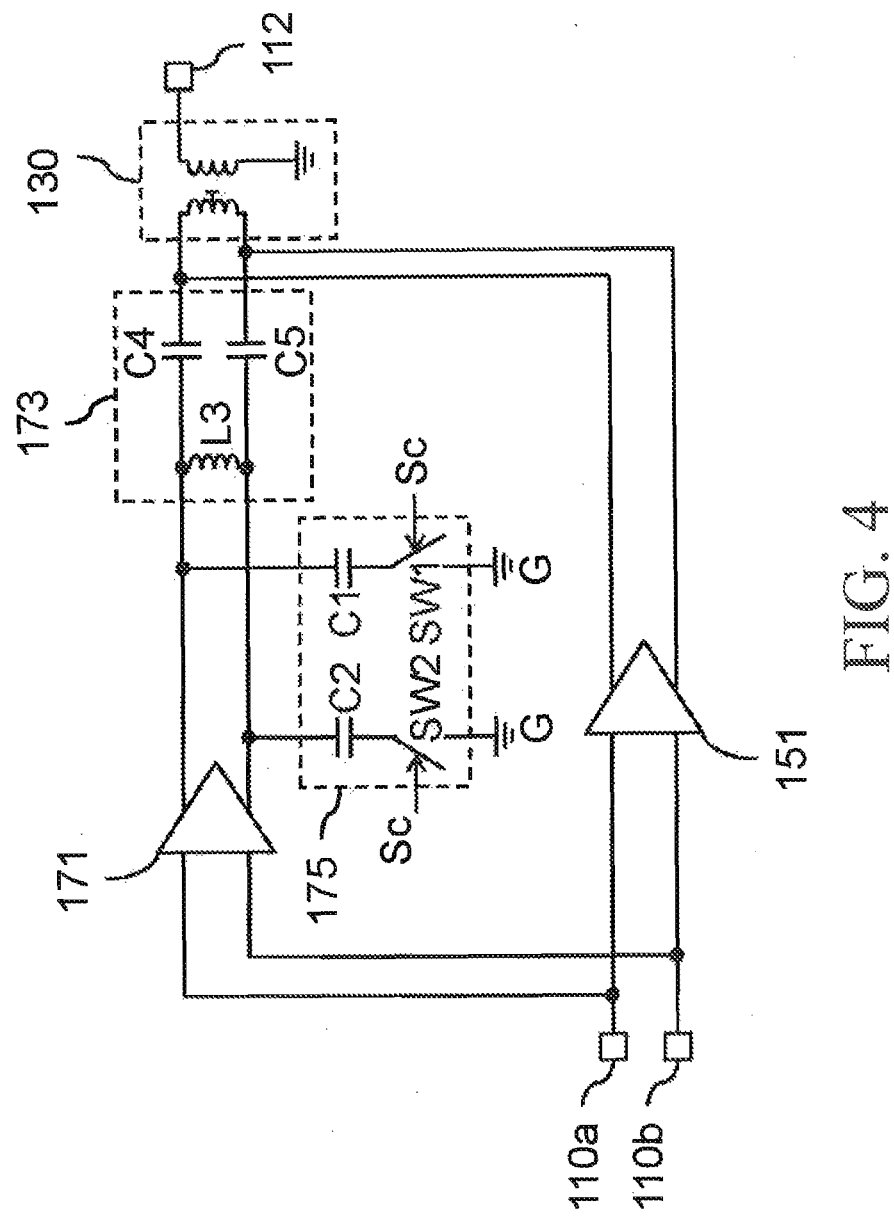
FIG. 4 is a schematic circuit diagram of a multi-mode power amplifying circuit according to another embodiment of the present invention.

In some embodiments (please refer to FIG. 4), the second impedance matching circuit 173 may include a capacitor C4, a capacitor C5, and an inductor L3.

The capacitor L3 is coupled to the output ends of the second power amplifier 171. In the differential mode, the capacitor L3 is coupled between the two output ends of the second power amplifier 171.

The capacitor C4 is coupled between an output end of the second power amplifier 171 and an input end of the first power amplifier 151 (one end of the primary side of the impedance converter). The capacitor C5 is coupled between the other output end of the second power amplifier 171 and the other input end of the first power amplifier 151 (the other end of the primary side of the impedance converter).

The inductors (for example, L1, L2, and L3), used in the second impedance matching circuit 173 may be a larger inductance, for example, larger than 5 nH, so as to significantly increase the impedance, for example, to be more than ten times of the output impedance of the first impedance matching circuit 130.

Corresponding to the foregoing multi-mode wireless transmission module, the present invention further provides a multi-mode wireless transmission method. In an embodiment, the multi-mode wireless transmission method includes: selecting either one of a first output mode and a second output mode according to different transmitting technologies (i.e. Wi-Fi or Bluetooth); performing steps corresponding to the selected output mode; and wirelessly outputting the radio-frequency signal, which is from a first impedance matching circuit, by using an antenna.

When the first output mode is selected, the radio-frequency signal is amplified by using a first power amplifier; the radio-frequency signal amplified by the first power amplifier is blocked from flowing into a second power amplifier by using an impedance of a second impedance matching circuit; and the radio-frequency signal amplified by the first power amplifier is transmitted to the antenna through the first impedance matching circuit.

When the second output mode is selected, the radio-frequency signal is amplified by using the second power amplifier; and the radio-frequency signal amplified by the second power amplifier is transmitted to the antenna through the second impedance matching circuit and the first impedance matching circuit.

In the foregoing embodiments, although a group of second power amplifying modules is taken as an example the present invention is not limited thereto, and two groups or more than two groups of second power amplifying modules may also be set as required.

Based on the above, according to the multi-mode power amplifying circuit, and the multi-mode wireless transmission module and method thereof in the present invention, multiple power amplifying modes can be provided for selection; and when any one of the power amplifying modes is selected, a high power efficiency can be achieved, thereby reducing the electric power consumption or improving the use efficiency of power supply.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A multi-mode power amplifying circuit, comprising:
   a signal input end;
   a first impedance matching circuit;
   a first power amplifying module, comprising:
      a first power amplifier, electrically connected between the signal input end and the first impedance matching circuit; and
   a second power amplifying module, comprising:
      a second power amplifier, electrically connected to the signal input end;
      a second impedance matching circuit, electrically connected between the second power amplifier and the first impedance matching circuit; and
      a switching circuit, electrically connected to an input end of the second impedance matching circuit, for switching on-off corresponding to an operation of the first power amplifier and an operation of the second power amplifier;
      wherein in a first output mode, the switching circuit switches on to form an alternating current (AC) ground at the input end of the second impedance matching circuit, the first power amplifier is configured to amplify a radio-frequency signal, and the radio-frequency signal amplified by the first power amplifier is transmitted into the first impedance matching circuit and is blocked from flowing into the second power amplifier by using an impedance of the second impedance matching circuit; and
      wherein in a second output mode, the switching circuit switches off to activate communication between an output end of the second power amplifier and the input end of the second impedance matching circuit, the second power amplifier is configured to amplify the radio-frequency signal, and the radio-frequency signal amplified by the second power amplifier is transmitted into the first impedance matching circuit through the second impedance matching circuit.

2. The multi-mode power amplifying circuit according to claim 1, wherein the impedance of the second impedance matching circuit is larger than an input impedance of the first impedance matching circuit.

3. The multi-mode power amplifying circuit according to claim 1, further comprising: a controller, coupled to the switching circuit, for controlling the switching circuit to couple the input end of the second impedance matching circuit to the alternating current (AC) ground when the first power amplifier is in operation.

4. The multi-mode power amplifying circuit according to claim 1, wherein the switching circuit comprises:
   a capacitor, electrically connected to the input end of the second impedance matching circuit; and
   a switch, electrically connected between the capacitor and a ground.

5. The multi-mode power amplifying circuit according to claim 1, wherein the second impedance matching circuit comprises:
   an inductor, electrically connected between the first impedance matching circuit and an output end of the second power amplifier; and
   a capacitor, electrically connected to the output end of the second power amplifier.

6. The multi-mode power amplifying circuit according to claim 1, wherein the second impedance matching circuit comprises:
   a capacitor, electrically connected between the first impedance matching circuit and the output end of the second power amplifier; and
   an inductor, electrically connected to the output end of the second power amplifier.

7. The multi-mode power amplifying circuit according to claim 1, wherein the first power amplifying module and the second power amplifying module are electrically connected in parallel between the signal input end and the first impedance matching circuit.

8. The multi-mode power amplifying circuit according to claim 1, wherein the first power amplifier and the second power amplifier have different powers.

9. The multi-mode power amplifying circuit according to claim 8, wherein the first power amplifier has a power higher than that of the second power amplifier.

10. The multi-mode power amplifying circuit according to claim 1, wherein the first impedance matching circuit is an impedance converter, and the first power amplifier and the second impedance matching circuit are coupled to two ends of a primary side of the impedance converter.

11. A multi-mode wireless transmission method, comprising:
   selecting one of a first output mode corresponding to a first power amplifier and a second output mode corresponding to a second power amplifier, wherein an output end of the first power amplifier is coupled to an input end of a first impedance matching circuit and an output end of a second impedance matching circuit, and the second power amplifier is coupled to an input end of the second impedance matching circuit;

when the first output mode is selected, forming an alternating current (AC) ground at the input end of the second impedance matching circuit and performing a first signal amplification, the step of performing the first signal amplification, comprising:
  utilizing the first power amplifier to amplify a radio-frequency signal;
  utilizing an impedance of the second impedance matching circuit to block the radio-frequency signal amplified by the first power amplifier from flowing into the second power amplifier; and
  transmitting the radio-frequency signal amplified by the first power amplifier to an antenna through the first impedance matching circuit;

when the second output mode is selected, activating communication between the output end of the second power amplifier and the input end of the second impedance matching circuit and performing a second signal amplification, the step of performing the second signal amplification, comprising:
  utilizing the second power amplifier to amplify the radio-frequency signal; and
  transmitting the radio-frequency signal amplified by the second power amplifier to the antenna through the second impedance matching circuit and the first impedance matching circuit; and
  utilizing the antenna to wirelessly output the amplified radio-frequency signal from the first impedance matching circuit.

12. The multi-mode wireless transmission method according to claim 11, wherein the impedance of the second impedance matching circuit is larger than the input impedance of the first impedance matching circuit.

13. The multi-mode wireless transmission method according to claim 11, wherein the first power amplifier and the second power amplifier have different powers.

14. The multi-mode wireless transmission method according to claim 13, wherein the first power amplifier has a power higher than that of the second power amplifier.

15. The multi-mode wireless transmission method according to claim 11, wherein the second impedance matching circuit is matched to the output impedance of the first power amplifier.

16. The multi-mode wireless transmission method according to claim 11, further comprising:
  performing switch-on and switch off by a switching circuit according to the selected mode.

* * * * *